United States Patent [19]

Arenz et al.

[11] Patent Number: 4,863,798
[45] Date of Patent: Sep. 5, 1989

[54] REFRACTORY COMPOSITE MATERIAL AND METHOD OF MAKING SUCH MATERIAL

[75] Inventors: David L. Arenz, Whittier; Edward L. Paquette, Claremont; Marc G. Simpson, Los Angeles, all of Calif.

[73] Assignee: Refractory Composites, Inc., Whittier, Calif.

[21] Appl. No.: 222,257

[22] Filed: Jul. 21, 1988

[51] Int. Cl.$^4$ ................................................ B32B 9/00
[52] U.S. Cl. .................................. 428/368; 427/248.1; 427/249; 427/250; 428/378; 428/379; 428/381; 428/408
[58] Field of Search ...................... 427/248.1, 249, 250; 428/368, 378, 379, 380, 381, 408

[56] References Cited

U.S. PATENT DOCUMENTS

| | | | |
|---|---|---|---|
| 4,596,741 | 6/1986 | Endou et al. | 428/408 |
| 4,663,230 | 5/1987 | Tennent | 427/249 |
| 4,772,513 | 9/1988 | Sakamoto et al. | 428/408 |

Primary Examiner—William J. Van Balen
Attorney, Agent, or Firm—Ellsworth R. Roston; Charles H. Schwartz

[57] ABSTRACT

A porous substrate is formed from discrete elements preferably anisotropic and permeable to oxygen and preferably having a first coefficient of thermal expansion. A pyrolytic material permeable to oxygen may be deposited in a thin layer on the discrete elements. A barrier material (e.g. boron carbide or silicon carbide) may be deposited in a thin layer on the pyrolytic material to inhibit diffusion of elements into the pyrolytic material. A material impermeable to oxygen (e.g. boron nitride or silicon nitride) may be deposited in a thin layer on the barrier material. A refractory matrix permeable to oxygen may be deposited on the impermeable material. The matrix may include a metallic element (e.g. silicon, hafnium, tantalum or zirconium) and another element (e.g. oxygen, nitrogen, carbon or boron) chemically bonded to the metallic element. The matrix may have a second coefficient of thermal expansion different from the first coefficient and may have a minimal bond to the substrate. The matrix is accordingly able to move relative to the substrate with changes in temperature, partly because the pyrolytic material contributes to a shear between the matrix and substrate. A refractory material impermeable to oxygen may be deposited in a thin layer on the matrix and may include a metallic element (e.g. silicon, hafnium, tantalum or zirconium) and an element (e.g. oxygen, nitrogen and boron) chemically bonded to the metallic element. The different layers may be deposited on the substrate, each in a substantially uniform thickness, at an elevated temperature and at pressures pulsating at a particular rate, and in reverse directions, between first and second particular limits.

37 Claims, 4 Drawing Sheets

CARBON FIBER WITH
MULTILAYER COATING

FIG. 8

| | Pressure | Temperature | H₂ | Ar | CH₄ | BCl₃ | NH₄ | Reversing Frequency |
|---|---|---|---|---|---|---|---|---|
| Pyrocarbon | 10-80 | 1015 | 0.0 | 9.25 | 12.3 | 0.0 | 0.0 | 2 |
| B₄C | 10-80 | 900 | 3.7 | 9.25 | 1.54 | 3.1 | 0.0 | 2 |
| BN | 5-55 | 875 | 0.0 | 15.4 | 0 | 1.4 | 0.7 | 2 |

Pressure: Measured in torr, typical dwell at low pressure condition is 30 seconds. Pressure rise and fall rated are in the range of 1/2-1 torr per second. Dwell at elevated pressure condition is less than 5 seconds.

Temperature: Degrees Celsius

Flow Rates: Expressed at standard cubic centimeters per square centimeter (flow area) per minute.

Reversal Frequency: Flow Direction in Reactor is reversed every 2 minutes or less.

REFRACTORY COMPOSITE MATERIAL AND METHOD OF MAKING SUCH MATERIAL

This invention relates to refractory composite articles and to methods of producing such articles. More particularly, the invention relates to refractory composite articles which are hard, tough, dimensionally stable, resistant to corrosion and erosion and capable of operating satisfactorily through extended ranges of temperatures. The invention also relates to methods of producing such articles.

In recent years, a large and growing need has emerged for articles exhibiting a number of characteristics which are individually hard to achieve but which collectively have made attainment seem almost impossible. For example, the articles have been desired to be hard, tough and wear-resistant. The articles have also been desired to be resistant to corrosion and to erosion and to acids and bases normally encountered in commercial and industrial environments. The articles have also been desired to provide these characteristics through ranges of temperatures of several thousands of degrees centrigrade.

A considerable effort has been made, and substantial sums of money have been expended, to provide articles which meet the above specifications. In spite of such efforts and such expenditures of money, problems have still remained. A material has still not been provided which meets all of the parameters specified above.

In U.S. Pat. No. 4,397,901 issued to me on Aug. 9, 1983, for "Composite Article and Method of Making Same" and assigned of record to the assignee of record of this application, I disclose and claim a refractory composite material which fulfills the parameters specified above. For example, the article disclosed and claimed in U.S. Pat. No. 4,397,901 is hard, tough, dimensionally stable, resistant to corrosion and erosion and capable of operating satisfactorily through extended ranges of temperatures in excess of 2000° F. The article disclosed and claimed in U.S. Pat. No. 4,397,901 is also relatively light and is able to provide the characteristics discussed above even when produced in relatively thin layers.

This invention provides a matrix and a substrate in a combination which meets all of the conditions specified above but which has enhanced characteristics relative to the material of U.S. Pat. No. 4,397,901. In this invention, the substrate and the matrix have a minimal bond and have different coefficients of thermal expansion such that the matrix can be displaced relative to the substrate with changes in temperature. This invention particularly provides a combination of a matrix and a substrate and layers disposed between the matrix and the substrate to preserve the characteristics of the substrate and to provide an impermeable layer between the substrate and the matrix. Such layers also facilitate the displacement of the matrix relative to the substrate with changes in temperature. The invention further relates to methods of producing such combinations of a substrate, barrier and impermeable layers and a matrix.

In one embodiment of the invention, a porous substrate is formed from discrete elements preferably anisotropic and permeable to oxygen and preferably having a first coefficient of thermal expansion. A pyrolytic material permeable to oxygen may be deposited on the discrete elements. A barrier material (e.g. boron carbide or silicon carbide) may be deposited in a thin layer on the pyrolytic material to prevent diffusion of elements into the pyrolytic material. A material impermeable to oxygen (e.g. boron nitride or silicon nitride) may be deposited in a thin layer on the barrier material.

A refractory matrix permeable to oxygen may be deposited on the impermeable material. The matrix may include a metallic element (e.g. silicon, hafnium, tantalum or zirconium) and another element (e.g. oxygen, nitrogen, carbon or boron) chemically bonded to the metallic element. The matrix may have a second coefficient of thermal expansion different from the first coefficient and may have a minimal bond to the substrate. The matrix is accordingly able to move relative to the substrate with changes in temperature, partly because the pyrolytic material contributes to a shear between the matrix and substrate.

A refractory material impermeable to oxygen may be deposited in a thin layer on the matrix and may include a metallic element (e.g. silicon, hafnium, tantalum or zirconium) and an element (e.g. oxygen, nitrogen and boron) chemically bonded to the metallic element. The different layers may be deposited on the substrate, each in a substantially uniform thickness, at an elevated temperature and at pressures pulsating at a particular rate between first and second particular limits and in reverse directions of vapor flow for such pressure pulsations.

In the drawings:

FIG. 8 is a table showing the materials and parameters used in different embodiments of methods within the scope of this invention to produce the articles included within the scope of this invention.

In one embodiment of the invention, a substrate generally indicated at 10 may be provided with porous, permeable and anisotropic properties. The substrate 10 is included in an article generally indicated at 11. The substrate may be formed from discrete elements 12 such as fiber or grains or a mixture of fibers and grains. The discrete elements may have a carbon or ceramic base. By way of illustration, the discrete elements may be formed from a suitable material such as pyrolyzed wool, rayon, polyacrylonitrile and pitch fibers. Carbonized rayon felt, chopped fibers of carbonized polyacrylonitrile, carbonized rayon cloth made from interwoven carbon fibers, a tape material made of closely woven, carbonized PAN fibers, a macerated material comprising a multiplicity of randomly oriented pyrolyzed wool fibers and a macerated material having a multiplicity of chopped pitch fibers have specifically been used.

The substrate can also advantageously be formed from a slurry comprising granular material such as silicon carbide or graphite. Such granular material can also be mixed with short lengths of high temperature resistant fibers selected from the group consisting of ceramic, pyrolyzed wool, rayon, polyacrylonitrile and pitch. The slurry may also include a suitable carbonaceous binder such as petroleum pitch, coal tar pitch, furan resins and phenolic resins. The slurry used to form the substrate may also comprise short lengths of polyacrylonitrile fibers intermixed with silicon carbide in granular form.

The different substrates described above may be formed on a continuous basis or may be formed by cyclic or pulsing techniques. When cyclic or pulsing techniques are used, a sequence of steps is provided under controlled conditions for limited periods of time and the sequence is repeated more than once. An example is specified in Example 11 in co-pending application Ser. No. 149,216 filed by James Warren on Jan. 28, 1988, for "Refractory Composite Material and Method of Producing Material" and assigned of record to the assignee of record of this application.

Figure 2:
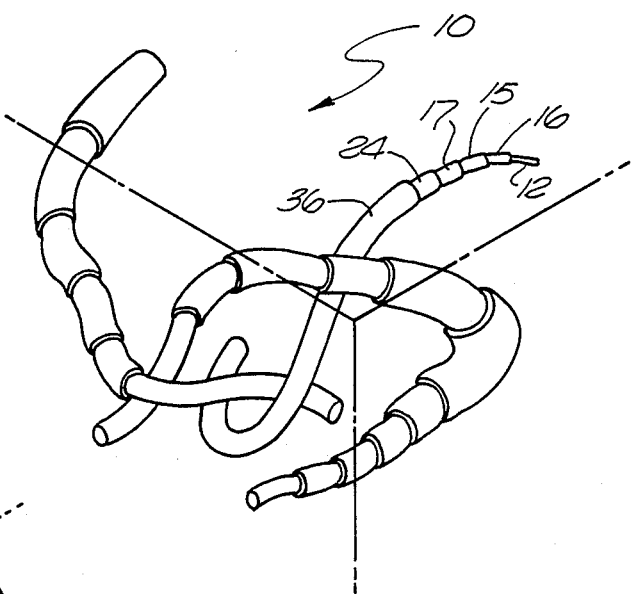
FIGS. 2 through 5 are schematic illustrations of different embodiments of articles included within this invention.

The substrate described in the previous paragraphs may be directly coated (FIG. 3) with a thin layer 15 of a barrier material and a thin layer 17 of a material impermeable to oxygen, as shown in FIG. 2. However, in order to coat the layers 15 and 17 directly on the substrate 10, the substrate 10 is initially shaped preferably to a configuration corresponding to that desired for the finished article. The substrate 10 is then preferably retained in the desired configuration while the layers 15 and 17 are being deposited on the substrate 12. This retention may be provided by a tool or fixture (not shown) which is constructed to retain the substrate 10 in the desired configuration while still providing for the coating of the layers 15 and 17 at every desired position on the substrate. Coating of the layers 15 and 17 on the substrate in this manner is advantageous in that it is direct and does not require any intermediate preparation of the substrate. However, it generally requires the preparation of special tools and fixtures. Furthermore, it increases the space requirements for the coating operation because of the use of the tools or fixtures. It also tends to slow the rate at which the layers 15 and 17 are coated on the substrate 10.

Figure 3:
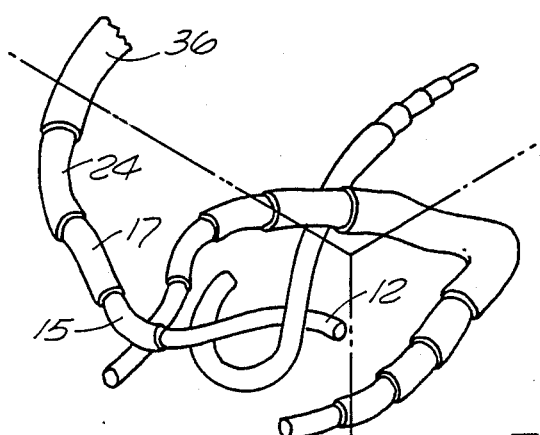

Alternatively, pyrolyzed carbon 16 (FIG. 2) may be deposited in a thin layer on the substrate 10, as shown in FIG. 3, before the deposition of the layers 15 and 17 on the substrate. The thickness of this layer may illustratively be two thousand angstroms (2000 ÅA). The pyrolyzed carbon 16 facilitates the promotion of a good load transfer between fibers in the substrate, particularly when the article is stressed. The pyrolyzed carbon 16 also helps to strengthen and stabilize the substrate 10, particularly when the article is subjected to stress. It also enhances the mechanical interface for increasing the surface fracture energy of the composite structure defining the article 11, thus enhancing the toughness and flow resistance of the refractory composite article 11.

To provide the coating 16 of pyrolyzed carbon on the substrate 10, the substrate may be disposed in a furnace of conventional design. The temperature of the substrate may then be raised to a suitable temperature such as approximately 1800° F. and a vacuum in the order of 15 mm mercury (Hg) may be maintained within the deposition chamber. Pyrolyzed carbon may then be deposited about each of the discrete elements 12 in the substrate 10 by flowing methane gas through the porous substrate for an extended period of time such as about fifty (50) hours. In this way, the pyrolyzed carbon encases each of the discrete elements 12 in the substrate 10.

When the pyrolyzed carbon is deposited on the substrate 10 in the manner discussed in the previous paragraph, it encases the discrete elements defining the substrate. This is illustrated schematically at 16 in FIG. 2. The layer of pyrolyzed carbon 16 is preferably porous, permeable to oxygen and anisotropic. With a density of the substrate on the order of 0.3 gm/cc and a fiber volume of about fifteen percent (15%) before the deposition of the pyrolyzed carbon 16, the substrate encased with the pyrolyzed carbon may have a density in the order of 0.75 gm/cc. The pyrolyzed carbon 16 serves to position the discrete elements 12 in the substrate 10 and to strengthen the substrate for handling purposes. In this way, the matrix 24 can be deposited on the substrate 10 without requiring any tools or fixtures to be used.

The pyrolyzed carbon 16 can be deposited on the substrate by other techniques than those discussed above. For example, the substrate 10 can be coated with any suitable and conventional type of resin such as a phenolic designated by Monsanto Chemical Company as Monsanto 1008. As a first step, the phenolic may be dissolved in a solvent such that it is fluid. The solvent may illustratively be methylethylketone. The substrate 10 may then be coated with the phenolic and partially polymerized so that it is dry to the touch. Patterns of the desired shape can then be cut from the substrate 10 or the substrate can be heated to a temperature of at least 160° F., compressed and then cut to the desired shape. The patterns in the desired shape may then be placed in a mold and heated to a suitable temperature such as approximately 350° F. to cure the phenolic. The patterns may then be cured at a temperature above 350° F. to stabilize the system.

Figure 4:
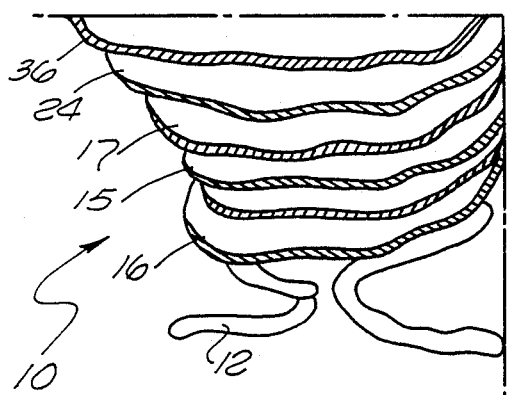

The phenolic is then pyrolyzed at a temperature of approximately 1600° F. to decompose it to carbon, its elemental form. One reason for the pyrolysis is to prevent the substrate from thereafter emitting gases when it is heated. However, the discrete elements 12 are retained in position by the pyrolyzed carbon 16 which is disposed in the interstices between the discrete elements, as shown in FIG. 4. The deposition of the pyrolyzed carbon 16 in the interstices between the discrete elements 12 is illustrated schematically in FIG. 2. The combination of the discrete elements 12 and the pyrolyzed carbon 16 in the interstices is porous, permeable to oxygen and anisotropic.

When the binder constituting the phenolic is pyrolyzed as discussed in the previous paragraph, it loses approximately half of its mass and it shrinks and cracks. In spite of this, the pyrolyzed carbon is able to hold the discrete elements 12 in position in the substrate and to impart strength to the substrate. The substrate 10 is then heated to a temperature of approximately 2200° F. for a relatively short period of time to impart a final shrink and pyrolyzation to the binder.

Polyurethane or polyethylene can be included in the phenolic binder before the binder is cured and pyrolyzed as discussed in the previous paragraphs. When the substrate 10 and the binder are then heated to approximately 1600° F., the polyurethane or polyethylene vaporizes and facilitates the formation of tunnels in the substrate. As will be disclosed in detail subsequently, the tunnels are effective in providing paths for depositing the barrier layer 15, the impermeable layer 17 and the matrix 24 on the substrate 10 as by chemical vapor deposition.

Instead of using a wet binder to coat the discrete elements 12, a dry binder may be used. Dow Corning Polycarbosilane 6-2330 is illustrative. This is a dry resin which may be mixed with methylethylketone to provide a fluid mixture with which to work. This material has properties of becoming partially polymerized at room temperatures. The material is mixed with the substrate and is then heated to a temperature of approximately 1600° F. to pyrolyze the binder. The material is subsequently heated to a temperature of approximately 2200° F. to provide it with a final pyrolyzation and shrink.

Figure 5:
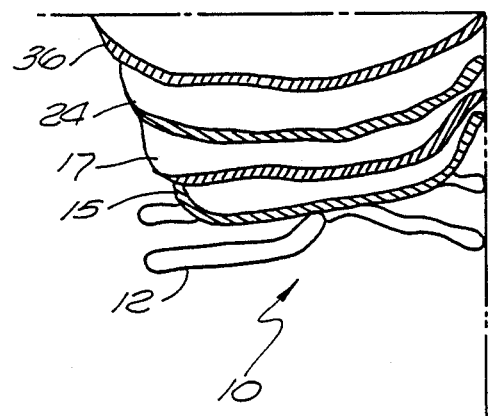

Sodium silicate or colloidal alumina can also be used as binders. The substrate 10 may be dipped into sodium silicate in liquid form and may then be heated. The sodium silicate flows along the lengths of the discrete elements 10 and tends to congregate or agglomerate at the interstices between the discrete elements. The formation of layers of material at the interstices between the fibers of the substrate 10 is shown in FIGS. 4 and 5.

As will be appreciated, the characteristics of the substrate can be considerably varied without departing from the scope of the invention. For example, when fibers are used in a woven form, the relative numbers of threads in warp and woof can be varied in great proportions and the spacing between the threads can also be varied considerably.

A suitable element such as boron can be applied to the substrate 10 in compound form with other elements such as carbon and/or nitrogen to form the intermediate layers 15 and 17 between the substrate 10 and the matrix 24. These intermediate layers 15 and 17 may be deposited on the substrate 10 before the deposition of the matrix 24, as shown in FIG. 5. The intermediate layers 15 and 17 may also be deposited on the pyrolyzed layer 16 as shown in FIG. 4.

The intermediate layer 15 may constitute a suitable material such as boron carbide ($B_4C$) and the intermediate layer 17 may constitute a suitable material such as boron nitride (BN). The boron carbide serves as a barrier layer to inhibit the boron from the boron nitride from infiltrating or diffusing into the pyrolytic layer 16. The boron nitride provides a layer impermeable to oxygen. This prevents oxygen from decomposing the carbon in the substrate 10 and the pyrolyzed layer 16. The layers 15 and 17 may encase the pyrolytic material 16 (FIG. 2) or may be deposited on the interstices of the pyrolytic material (FIG. 4).

The pyrolitic layer 16, the barrier layer 15 and the impermeable layer 17 may be deposited in thin layers each having a substantially uniform thickness. For example, the thickness of each of the layers 16, 15 and 17 may be on the the order of approximately two thousand Angstroms (2000 Å). The layers 15 and 17 may encase the pyrolytic layer 16 when the pyrolytic layer encases the substrate 12. Similarly, the layers 15 and 17 may be disposed in the interstices of the pyrolytic layer 16 on the discrete elements 12 when the pyrolytic layer is disposed on the interstices of the discrete elements.

The pyrolytic layer 16, the layer 15 of the barrier material and the layer 17 of the impermeable material may be formed by chemical vapor infiltration techniques. These techniques are available because the discrete elements 12 in the substrate 10 occupy approximately only thirty five percent (35%) to forty percent (40%) of the volume of the substrate. Because of the relatively low volume occupied by the discrete elements 12, the gases forming each of the layers 16, 15 and 17 are able to infiltrate into the interior of the substrate and produce depositions throughout the volume of the substrate.

The uniform depositions of the layers 16, 15 and 17 on the substrate 10 are facilitated by subjecting the chemical vapors in the infiltration process to elevated temperatures and to pulsating pressures (FIG. 8) and by further subjecting the gases to periodic reversals in the direction of flow through the substrate. For example, the pyrolytic layer 16 may be produced at a temperature of approximately 1015° C. and may be subjected to pressures between approximately ten torr (10 torr) and approximately eighty torr (80 torr) at a rate of approximately one and one half torr (1.5 torr) per second. The typical dwell time at the bottom pressure may be approximately thirty (30) to approximately sixty (60) seconds. The typical dwell time at the top pressure may be approximately five (5) seconds. The direction of the flow of the chemical vapors may be reversed approximately every two (2) minutes or less.

In depositing the layer 16 on the substrate 10, methane ($CH_4$) may be flowed through the substrate at a rate of approximately twelve and three tenths (12.3) cubic centimeters per square centimeters per minute (FIG. 8). The methane may be mixed with argon (Ar), which is flowed through the substrate 10 at a rate of approximately nine and one quarter (9.25) cubic centimeters per square centimeter per minute. Argon is neutral. It imparts energy to the methane and controls the rate at which carbon from the methane is deposited on the substrate 10. Other neutral gases such as helium can be used instead of, or with, the methane to deposit the pyrolytic carbon 16 on the substrate 10.

The pressure cycling technique discussed above between pressures such as ten torr (10 torr) and one hundred torr (100 torr) is used to augment substantially the diffuse mass transport process which is at work in a steady state chemical vapor infiltration (CVI) process. With such techniques, infiltration depths of at least fifty mils (50) have been achieved. This has meant the difference between an impractical (the steady-state) process and a practical (the pressure-pulsating) process.

The increased infiltration of the methane and argon into the substrate 10 to form the pyrolytic layer 16 may be seen from the following analysis. As the pressure of the gases in the chemical vapor infiltration (CVI) process increases, the pressure external to the substrate 10 increases on a corresponding basis. However, the pressure of the gases within the substrate 10 does not increase as fast as the pressure of the gases outside of the substrate. This may result in part from the fact that the pores in the substrate 10 are relatively small so that the pressure of the gases within the substrate 10 cannot follow the pressure of the gases outside of the substrate as the pressure of the gases increases. This differential of pressure acts upon the methane and argon gaseous reactants to produce a flow of such material into the innermost reaches of the substrate 10 and to produce a deposit of the carbon there. This provides for a substantially uniform deposition of the carbon not only on the surface of the substrate 10 but also within the interior of the substrate.

Following the introduction into the furnace or chamber of the methane and the argon and the pulsation of the pressure of the gases in the furnace or chamber, the gases may be withdrawn from the furnace by producing a mild vacuum. Fresh gases containing methane and argon may be then introduced into the furnace for flow in an opposite direction through the substrate 10. The fresh gases may then be pulsed in a manner similar to that described above. This process may be repeated through a number of cycles for a flow of the gases in one direction, and alternately in an opposite direction, through the substrate 10 until the pyrolytic material 16 has been formed with the desired thickness.

The periodic introduction of gases into the furnace and subsequent exhaustion of these gases from the furnace provide certain important advantages. As will be seen, the composition of the gases introduced to the furnace changes with time because of the chemical reactions in the gases and because of the exhaustion of the gases as the gases are chemically reacted to produce the pyrolytic layer 16. This causes the properties of the pyrolytic layer 16 to vary with time. By exhausting these gases from the furnace after a relatively short period of time and subsequently introducing a new supply of such gases into the furnace, relatively constant characteristics can be provided for the pyrolytic layer 16 along the various microscopic dimensions of the article being processed.

The reversal in the direction of flow of the methane and the argon also offers certain advantages. It assures that the thickness of the pyrolytic layer 16 will be substantially uniform throughout the substrate. If the direction of flow of the methane and the argon is not reversed, the pyrolytic coating 16 may have a greater thickness at the end at which the gases enter the substrate than at the end at which the gases leave the substrate. By reversing the direction of flow of the gases, any such difference in the thickness of the pyrolytic layer 16 at the opposite ends of the substrate 10 is compensated. Furthermore, the thickness of the deposition at the center of the substrate 10 is also enhanced reversing the direction of the flow of the gases.

The barrier layer 15 is produced by a chemical vapor infiltration process similar to that described above. However, the temperature of the process may be approximately 900° C. and the gases used may be a mixture of hydrogen ($H_2$), argon (Ar), methane ($CH_4$) and boron trichloride ($BCl_3$). The hydrogen may be flowed through the substrate 10 at a rate of approximately three and seven tenths (3.7) cubic centimeters per square centimeter per minute, the argon at a rate of approximately nine and one quarter (9.25) cubic centimeters per square centimeter per minute, the methane at a rate of approximately one and fifty four hundred hundredths (1.54) cubic centimeters per square centimeter per minute and the boron trichloride at a rate of approximately three and one tenth (3.1) cubic centimeters per square centimeter per minute (FIG. 8). The gases may be pulsed, and the direction of the flow of the gases may be reversed, in a manner similar to that discussed above for the deposition of the pyrolytic layer 16 on the substrate 10.

As the gases pass through the substrate 10, the boron in the boron trichloride and the carbon in the methane combine to produce boron carbide ($B_4C$). The hydrogen from the methane and the chlorine from the boron trichloride are exhausted as gases from the furnace. The hydrogen introduced as a separate gas into the furnace affects the chemical and heat balance of the gases introduced to the furnace. The amount of the hydrogen introduced into the furnace can be varied to affect this chemical and heat balance. The argon has the same affect as discussed above with respect to the pyrolytic layer 16.

The impermeable layer 17 is also produced by chemical vapor infiltration techniques in a manner similar to that discussed above. However, the permeable layer 17 may be produced at a temperature of approximately 875° C. and may be produced by a mixture of argon (Ar), boron trichloride ($BCl_3$) and ammonia ($NH_4$). The argon may be passed through the substrate at a rate of approximately fifteen and four tenths (15.4) cubic centimeters per square centimeter per minute, the boron chloride at a rate of approximately one and four tenths (1.4) cubic centimeters per square centimeter per minute and the ammonia at a rate of approximately seven tenths (0.7) per cubic centimeter per minute (FIG. 8). The variations in pressure of the gases, and the reversal in the direction of the flow of the gases, may be as discussed above with respect to the pyrolytic layer 16.

The boron from the boron trichloride and the nitrogen from the ammonia combine to form boron nitride (BN) which is deposited on the substrate to form the impermeable layer 17. The chlorine in the boron trichloride and the hydrogen in the ammonia then pass through the furnace as molecules of gas. The argon is included in the mixture for the reasons discussed above with respect to the pyrolytic layer 16.

Figure 6:
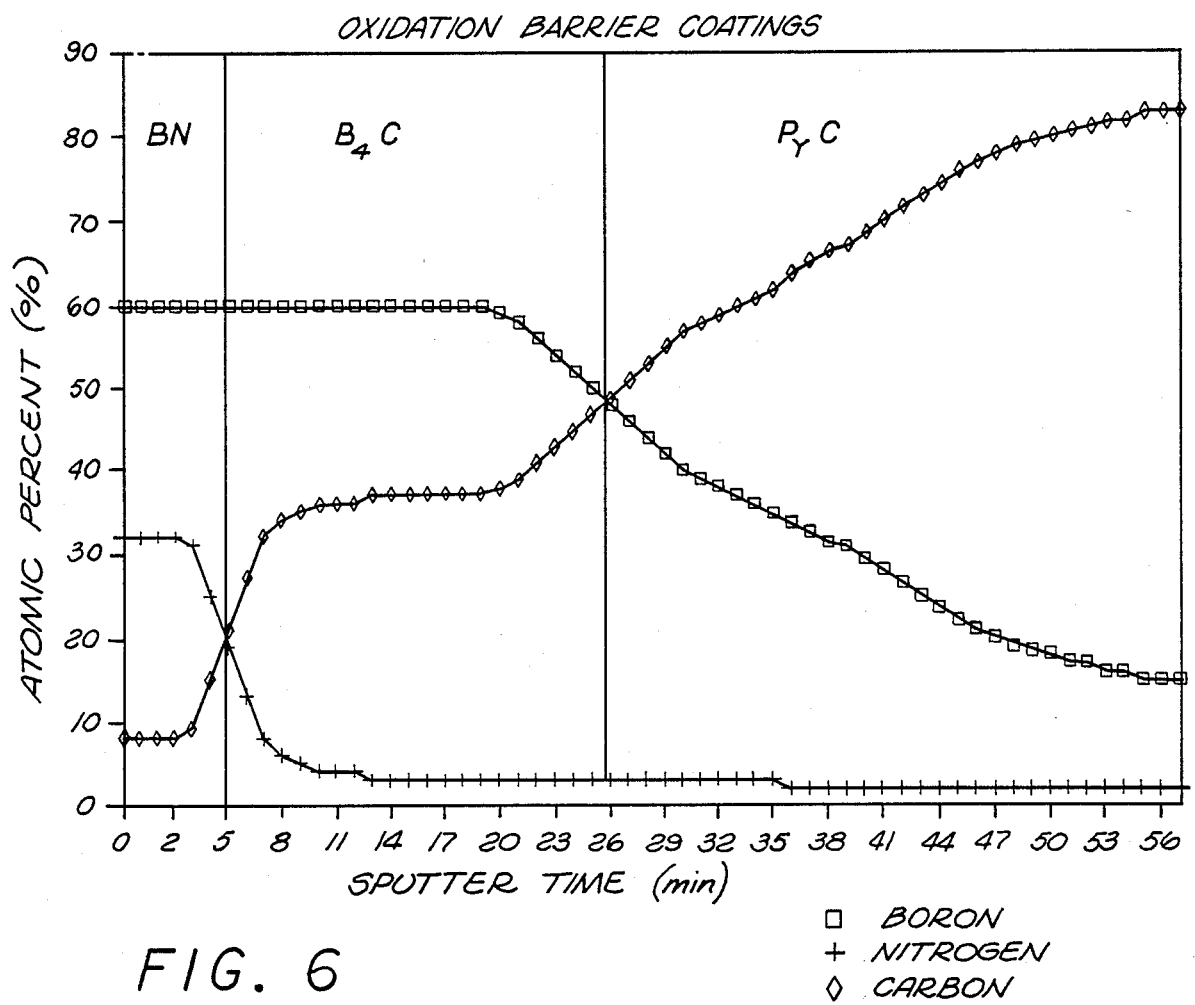
FIG. 6 is a curve showing the relative compositions of different elements at individual positions in successive layers on a substrate.

FIG. 6 shows the advantages of providing the layers 16, 15 and 17 on the substrate 10. As will be seen in FIG. 6, the sputter time for removing the layers 16, 15 and 17 on the substrate 10 is shown in minutes on the horizontal axis. Thus, approximately thirty (30) minutes is shown in FIG. 6 as the sputter time for removing the pyrolytic layer 16 on the substrate 10; approximately twenty (20) minutes as shown as the sputter time for removing the barrier layer 15 on the substrate; and approximately five (5) minutes is shown as the sputter time for removing the impermeable layer 17 on the substrate. In effect, the horizontal axis indicates the progressive positions in each of the layers 16, 15 and 17 when a sectional cut is made in such layers. It should be noted that sputter time to remove each layer may not be relatively proportional. Each of the layers 17, 15 and 16 may be removed by bombarding the layer with argon atoms.

In FIG. 6, the atomic percent (%) of different materials is shown on the vertical axis. As will be seen, the relative amount of boron in the layers 16, 15 and 17 is shown by a curve whose positions are indicated by squares. FIG. 6 shows that the amount of boron in the layer 17 and the portion of the layer 15 adjacent the layer 17 remains constant. However, the amount of boron in the layer 15 starts to decrease as the positions of the layer progressively approach the layer 16, and the amount of boron continues to decrease with progressive positions into the layer 16. This tends to show that the barrier layer 15 is effective in inhibiting the infiltration into the layer 16 of the boron in the layer 17. For example, although the atomic percent of the boron in the layer 17 and most of the layer 15 is approximately sixty percent (60%), the atomic percent of the boron in the pyrolytic layer 16 is approximately fifty percent (50%) at the boundary with the layer 15 and is less than twenty percent (20%) at the boundary with the substrate 10. It is desirable to minimize the amount of the boron in the pyrolytic layer 16 because the boron tends to weaken the pyrolytic layer and to inhibit the action of the pyrolytic layer in providing for a shear of the matrix 24 relative to the substrate 10 with changes in temperature.

FIG. 6 also shows that the atomic percentage of nitrogen is slightly greater than thirty percent (30%) through most of the impermeable layer 16 and decreases quickly to a level significantly less than ten percent (10%) through most of the barrier layer 15 and all of the pyrolytic layer 16. The atomic percentage of the nitrogen is plotted as plus (+) positions in FIG. 6.

The atomic percentage of carbon is plotted in FIG. 6 by diamond positions. As will be seen, the atomic percentage of carbon is less than ten percent (10%) throughout most of the thickness of the impermeable layer 17 and rises to a level of approximately twenty percent (20%) at the boundary with the barrier layer 15. The atomic percentage of carbon continues to rise to a percentage between approximately thirty percent (30%) and forty percent (40%) in the barrier layer 15 and remains at this percentage throughout most of the thickness of the barrier layer. The atomic percentage of carbon then rises progressively to a percentage in excess of eighty percent (80%) at the boundary between the pyrolytic layer 16 and the substrate 12.

As shown in FIG. 6, the boron from the impermeable layer 17 is unable to diffuse to any significant extent into the pyrolytic layer 16. This may be because the boron carbide in the barrier layer 15 has four (4) carbon atoms to every boron atom. The vast preponderance of the carbon atoms in the barrier layer 15 may thus serve as a trap for the boron atoms to inhibit any material diffusion of the boron atoms through the barrier layer 15 into the pyrolytic layer 16. The action of the boron carbide in inhibiting the diffusion of boron from the boron nitride into the pyrolytic layer 16 may also result from the fact that the carbon in the boron carbide is compatible with the carbon in the pyrolytic layer 16.

The barrier layer 15 also provides another significant advantage. As the oxygen from the atomosphere leaks into the barrier layer 15, it attacks the boron carbide and causes boron suboxides to be produced. These boron suboxides are volatile and migrate through the oxygen leak path toward the atmosphere. The suboxides meet the oxygen leaking into the barrier layer 15 from the atmosphere and cause the suboxides to become fully oxidized to boron oxide ($B_2O_3$). The boron oxide tends to plug the leak path so that oxygen cannot continue to leak through this path to the barrier layer 15. By plugging such leak paths, oxygen is unable to leak to the pyrolytic layer 16 and the substrate 10. This is important because the oxidation of the pyrolytic layer 16 and the substrate 10 tends to weaken, and ultimately to destroy, the pyrolytic layer and the substrate. The self plugging feature of boron carbide tends to occur at relatively moderate temperatures such as approximately 1300° C. and at temperatures even lower than 1300° C.

Other materials than boron carbide can be used for the barrier layer 15 and other materials than boron nitride can be used for the impermeable layer 17. For example, silicon carbide can be used in place of boron carbide for the barrier layer 15 and silicon nitride can be used in place of boron nitride for the impermeable layer 17. The silicon carbide is effective as a barrier material in preventing the diffusion of silicon from the silicon nitride into the pyrolytic layer 16 and the substrate 10. The silicon nitride is effective as a material impermeable to oxygen. However, the combination of silicon carbide for the barrier material and silicon nitride for the impermeable material is not as advantageous as the combination of boron carbide for the barrier material and boron nitride for the impermeable material because the silicon carbide does not have the properties of becoming self plugged when subjected to oxygen leakage paths. Rhenium or irridium may also be used as the barrier layer 15 to control the diffusion of boron into the pyrolytic layer 16 but they also do not have the advantages discussed above for boron carbide.

Figure 7:
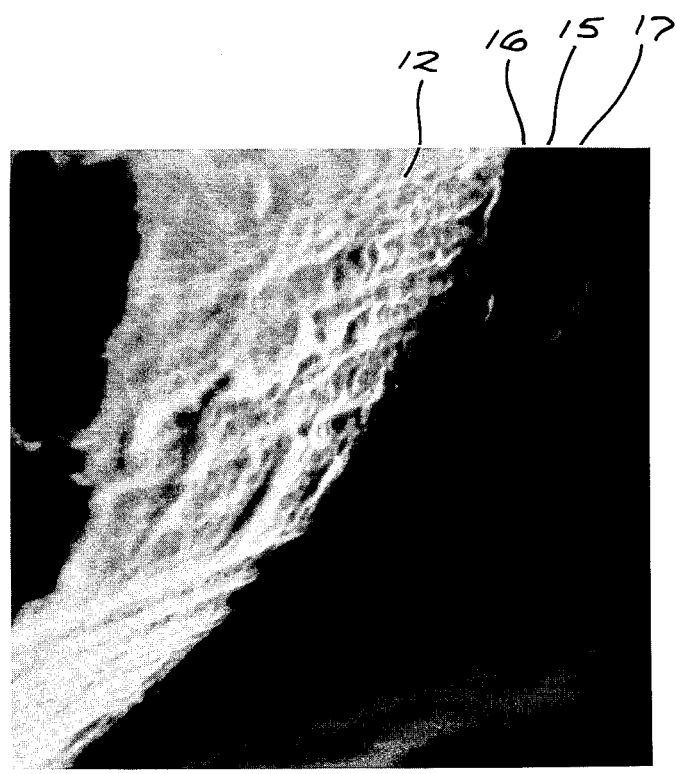
FIGS. 7 is a copy of a photograph, generally quite magnified, of the construction and characteristics of one embodiment of a material included within the scope of this invention.

FIG. 7 shows a cross section of an article constructed as discussed above and including the substrate 10, the pyrolytic layer 16, the barrier layer 15 containing boron carbide and the impermeable layer 17 containing boron nitride. The cross section shown in FIG. 6 has been obtained through the use of Auger Electron Spectroscopy and does not represent the actual thickness of the different layers in the article.

The combination of the barrier layer 15 and the impermeable layer 17 is also advantageous when the substrate 10 is formed from discrete elements made from a material such as silicon carbide. One type of such discrete elements may constitute "Nicalon" ceramic fibers. When the impermeable material such as boron nitride is disposed on such a substrate without including the barrier layer 15, the boron from the boron nitride tends to diffuse into the "Nicalon" ceramic fibers in the substrate 10 and severly damage such fibers and sharply reduce their mechanical properties. The inclusion of the layer 15 of boron carbide between the substrate 10 and the impermeable layer 17 materially limits the diffusion of the boron from the impermeable layer into the substrate.

In addition to the combinations discussed above for the layers 15 and 17, other combinations may also be used. For example, when the pyrolytic layer 16 is included, the barrier layer 15 may constitute silicon carbide and the impermeable layer 17 may constitute boron nitride. Alternatively, the barrier layer 15 may constitute silicon nitride ($Si_3N_4$) and the impermeable layer 17 may constitute boron nitride.

Instead of using boron trichloride to form the boron carbide and boron nitride layers, other materials such as boron flouride ($BF_3$) or boron hydroxide ($B_2H$) may be used. Hydrocarbons other than methane may also be used to produce the pyrolytic layer 16 and the boron carbide in the barrier layer 15. When the barrier layer constitutes silicon carbide and/or the impermeable layer constitutes silicon nitride ($Si_3N_4$), materials such as methyltrichlorosilane, dichlorosilane and other organometallics may be used.

The matrix 24 deposited on the impermeable layer 17 does not have any significant chemical or mechanical bond with the substrate 10 or the pyrolytic layer 16. Because of this, increased surface fracture energy (toughness) is produced between the substrate 10 and the matrix 24. The matrix 24 also has a significantly different coefficient of thermal expansion than the substrate 10. As a result, the matrix 24 is free to move relative to the substrate 10 with changes in temperature. This is particularly important because of the considerable range of temperatures (in the thousands of degrees Fahrenheit) in which articles formed from the refractory material of this invention are expected to work. The matrix 24 encases the impermeable layer 17 when the coating encases the substrate 10. The matrix 24 is disposed in the interstices of the discrete elements 12 when the impermeable layer 17 is disposed in such interstices. The matrix 24 may have a suitable thickness such as approximately six thousand Angstroms (6000 Å) when the layers 16, 15 and 17 have thicknesses such as two thousand Angstroms (2000 Å).

The matrix 24 may be formed from a suitable material consisting of a metal and a material providing negatively charged ions. Preferably the matrix 24 may be formed from a material selected from a group consisting of silicon nitride, silicon carbide, silicon oxide and silicon boride. The matrix 24 may be preferably formed from silicon carbide. Silicon carbide is advantageous because it is hard and tough and provides good protection to the substrate. The matrix may also be formed from other materials such the oxides, nitrides, carbides and borides of hafnium, zirconium, tantalum, tungsten and molybdenum.

To apply the matrix 24 on the substrate 10, the substrate may be disposed in a furnace and heated to a temperature in the range of about 1350° F. to 2500° F. Preferably the substrate 10 is heated to a temperature of about 1800° F. in a mild vacuum. This temperature is intermediate in a preferred temperature range of about 1600° F. to 2000° F. A suitable gas containing silicon and carbon may then be passed through and over the substrate 10 in the furnace. For example, suitable gases such as methyltrichlorosilane, dimethyldichlorosilane and trimethylchlorosilane may be used. The gas may be allowed to fill the furnaces to a pressure between about 0.01 and 0.6 atmospheres.

Following the introduction into the furnace of the gases containing the silicon and the carbon, the gases are withdrawn from the furnace by producing a mild vacuum. New gases containing silicon and carbon are then introduced into the furnace. This process is repeated through a number of cycles until the matrix has been formed with the desired thickness. The temperature of the substrate 10 may be intermittently raised to about 2700° F. to produce a dimensional stability between the silicon carbide in the matrix 24 and the pyrolyzed carbon 16 on the substrate 10. The direction of the flow of gases through the substrate 10 in each alternate cycle may be reversed in a manner similar to that discussed above. A number of specific examples for the production of the matrix 24 are disclosed in co-pending application Ser. No. 149,216 filed by James Warren on Jan. 27, 1988 for "Refractory Composite Material and Method of Producing Material" and assigned of record to the assignee of record of this application.

The particular chemical constituents produced to form the matrix material are dependent upon certain parameters including temperature, pressure, gases used, flow rate of the gases and mass rate of the gases. The mass rate is in turn dependent upon such factors as flow rate and the particular gases used.

Other gases can be included in the chemical vapor deposition in addition to those specified above. For example, gases of argon and helium can be included in the gases introduced to the furnace. Both argon and helium are neutral. They impart energy to the gases in the furnace and they control the rate at which the matrix 24 is deposited on the substrate. They also control the characteristics of the deposition.

The relative amount of hydrogen in the gases can also be varied. The relative amount of hydrogen affects the chemical and heat balance of the gases introduced to the furnace. As a result, the relative amount of hydrogen in the gases affects the characteristics of the deposition. For example, when the furnace is maintained at a relatively low temperature and a considerable amount of hydrogen is introduced into the furnace, an excess of silicon above the stoichiometric ratio tends to be deposited. Furthermore, even slight changes in temperature can affect the hardness of the deposition. By way of illustration, a change of about 10° F. in the furnace can produce a change of as many as 1000 points in Vickers hardness out of a range of approximately 1300–4400 in Vickers hardness. Thus, the mixture of a small amount of hydrogen with the gases producing the matrix 24 may have a significant effect on the hardness of the matrix which is produced.

Boron can also be included in the gases introduced into the furnace to obtain the chemical vapor deposition of the matrix 24 on the impermeable layer 17. The inclusion of boron in the mixture enhances the tendency of the matrix 24 produced from the deposition of the gases to be forgiving. This enhances the toughness of the matrix 24 and the ability of the matrix to withstand strain. The boron in the mixture acts as a getter. It accumulates the material of the matrix 24, such as silicon carbide, from active sites and causes the silicon carbide from such active sites to be sintered together. Without the inclusion of the boron, the silicon carbide tends to be deposited at the active sites. Nominally about two percent (2%) by weight of the boron may be included in the mixture. Preferably the range of boron is about one percent (1%) to three (3%) by weight. Preferably less than five percent (5%) of boron by weight is included in the mixture.

Other gases may be used in producing a chemical vapor deposition of the matrix 24 on the substrate 10. For example, a mixture of silicon tetrachloride and methane may be used. The mixture of silicon tetrachloride and methane tends to produce a deposition of silicon carbide to form the matrix. Such a mixture may require a greater amount of energy to produce the matrix than some of the gases specified above.

As will be appreciated, the substrate 10 disposed in the furnace can be pre-heated to impart energy to the gases in the furnace for enhancing the production of a chemical reaction of the gases. The resultant deposition of the material such as silicon carbide on the substrate 10 to form the matrix 24 has first characteristics. Alternatively, the substrate does not have to be pre-heated before being introduced into the furnace. In either case, the gases receive sufficient kinetic energy to produce chemical reactions when they collide. Particles of silicon carbide are produced as a soot in free space as a result of such collisions and as a result of the chemical reactions occurring during the collisions.

The characteristics of the silicon carbide produced without pre-heating the substrate 10 are different from the characteristics of the silicon carbide produced by pre-heating the substrate. This results in part from differences in microscopic structure of the grains of silicon carbide deposited on the substrate. As will be appreciated, in addition to forming the matrix 24 by the two separate techniques discussed above, the matrix 24 can be formed by a combination of such techniques to provide the matrix with a blend of characteristics.

When the matrix 24 is formed from a suitable material such as silicon carbide in the manner described above, it tends to receive microscopic cracks in its periphery. These cracks are advantageous because they tend to impart resilience and flexibility to the matrix, particularly when the matrix is subjected to stresses. The cracks are disadvantageous because they increase the amount of the surface exposed to oxygen. As a result, there tends to be an increase in the rate at which the matrix 24 is oxidized.

An impermeable coating 36 may be disposed on the matrix 24 to cover the matrix and inhibit the oxidation of the matrix. This is particularly important when the matrix 24 has the microscopic cracks as discussed above. The coating 36 may be formed from a suitable material such as silicon oxide. Silicon oxide is advantageous because it is hard and because it is impermeable to oxygen. For example, since the silicon oxide already includes oxygen, it cannot be oxidized by the oxygen in the air. The silicon oxide has substantially the same coefficient of thermal expansion as the silicon carbide in the matrix 24. Because of this, it has properties of moving with the matrix 24 with changes in temperature.

The coating 36 of silicon oxide may be deposited on the matrix 24 under substantially the same conditions of various parameters such as temperature pressure and flow rate and direction reversal as those used to deposit the matrix 24 of silicon carbide on the substrate. The deposition of the silicon oxide on the matrix 24 may also be accomplished by liquid spray or immersion such as discussed above. Other materials such as silicon nitride may be provided as the layer 36. Furthermore, other materials such as metal oxides, metal nitrides, metal silicides, metal borides and metal carbides may also be used as the layer 36. The layer 36 may be viscous.

Figure 1:
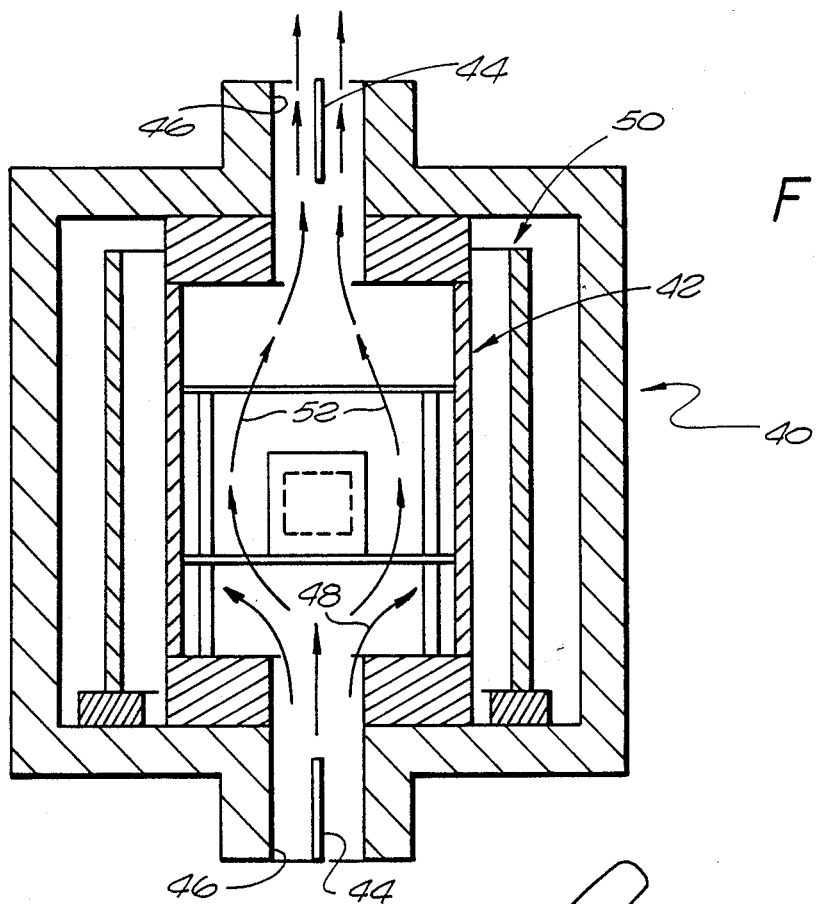
FIG. 1 is a schematic drawing of apparatus for producing the articles of this invention.

FIG. 1 illustrates a schematic diagram of a furnace, generally indicated at 40, which may be used to produce the composite materials described above. The furnace 40 includes an enclosure 42 having an inlet 44 and an outlet 46. Gases, such as those used to produce a chemical vapor deposition of the matrix 24 on the substrate 10, are introduced into the furnace 40 through the inlet 44. The gases flow downwardly along the walls defining the enclosures as indicated by arrows 48. The gases then flow upwardly along the enclosure 42, as indicated by arrows 52. Since the path defined by the arrows 48 and 52 within the furnace 40 is relatively long, the gases have a considerable opportunity to become heated to the temperature of the furnace heaters 50. The gases then flow within the space defined by the enclosure 42 and flow from the furnace 40 through the outlets 46. During the flow of the gases within the enclosure 42, the gases have an opportunity to become deposited on the article, such as the substrate 10, in which a deposition is to be provided. When the direction of gaseous flow is to be reversed as discussed above, the furnace 40 may be disposed to cyclically close and open opposing inlets 44 and outlets 46 and gases may then be passed through the article 11 in opposite directions to produce the successive layers defining the article.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

We claim:
1. A refractory composite material,
a porous permeable substrate defined by a plurality of discrete elements,
a pyrolytic layer covering the discrete elements in the substrate,
a layer of a material covering the pyrolytic layer and providing a barrier to inhibit diffusion into the pyrolytic layer, and
a layer of a material covering the barrier layer and compatible with the material of the barrier layer and having properties of being impermeable to oxygen.

2. A refractory composite material as set forth in claim 1, including,
a matrix disposed on the impermeable layer,
the substrate having a first coefficient of thermal expansion and the matrix having a second coefficient of thermal expansion different from the first coefficient of thermal expansion.

3. A refractory composite material as set forth in claim 2, including,
there being a minimal bond between the substrate and the matrix to provide for a movement of the matrix relative to the substrate with changes in temperature.

4. A refractory composite material as set forth in claim 3 wherein
the discrete elements in the substrate are anisotropic and are permeable to oxygen and wherein the impermeable layer inhibits the oxidation of the discrete elements in the substrate.

5. A combination as set forth in claim 1 wherein
the discrete elements in the substrate are carbonaceous and
the pyrolytic layer is carbonaceous and
the barrier layer and the impermeable layer include an element selected from the group consisting of boron and silicon.

6. A combination as set forth in claim 3 wherein
the discrete elements in the substrate are carbonaceous and
the pyrolytic layer is carbonaceous and
the barrier layer and the impermeable layer include an element selected from the group consisting of boron and silicon and
the matrix is formed from a refractory material defined by a refractory element chemically bonded to an element selected from the group consisting of oxygen, nitrogen, carbon and boron.

7. A refractory composite material, including,
a porous substrate defined by a plurality of discrete elements,
first means covering the discrete elements in the substrate and having properties of providing shear,
second means covering the first means and providing a diffusion barrier, and
third means covering the second means and defining a barrier impermeable to oxygen.

8. A refractory composite material as set forth in claim 7, including,
the second means being formed from a material having properties of reacting with oxygen infiltrating into the second means to form a compound inhibiting any further infiltration of oxygen into the second means.

9. A refractory composite material as set forth in claim 8, including,
the first means having a substantially uniform thickness at the different positions on the substrate and
the second means having a substantially uniform thickness at the different positions on the first means and
the third means having a substantially uniform thickness on the second means.

10. A refractory composite material as set forth in claim 7, including,
a matrix disposed on the third means and having a minimal bond relative to the substrate for movement relative to the substrate with changes in temperature.

11. A refractory composite material as set forth in claim 10, including, means disposed on the matrix and defining a barrier impermeable to oxygen.

12. A refractory composite material as set forth in claim 8, wherein
the second and third means include boron.

13. A refractory composite material, including,
a porous, permeable substrate having a first coefficient of thermal expansion,
a pyrolytic layer disposed on the substrate,
means disposed on the pyrolytic layer and having impermeable properties and including a particular element providing a barrier against diffusion of the particular element into the pyrolytic layer.

14. A refractory composite material as set forth in claim 13 wherein
the porous, permeable substrate and the pyrolytic layer include carbon as an element and
the particular element in the barrier means is boron.

15. A refractory composite material as set forth in claim 13, including,
a matrix disposed on the barrier means,
the substrate having a first coefficient of thermal expansion and the matrix having a second coefficient of thermal expansion,
the pyrolytic layer having properties of providing a minimal bond between the substrate and the matrix to facilitate a displacement of the matrix relative to the substrate with changes in temperature.

16. A refractory composite material as set forth in claim 15 wherein
the substrate and the pyrolytic layer are made from materials including carbon and
the barrier means include boron as the particular element.

17. A refractory composite material, including,
porous substrate means,
barrier means disposed on the substrate means and including a particular element and having properties of preventing the diffusion of the particular element into the substrate means, and
a matrix disposed on the barrier means and having properties of being movable relative to the substrate means with changes in temperature.

18. A refractory composite material as set forth in claim 17, including,
the substrate means having a first coefficient of thermal expansion, and
the matrix having a second coefficient of thermal expansion different from the first coefficient of thermal expansion and providing a minimal bond with the substrate means to facilitate a displacement of the matrix relative to the substrate means with changes in temperature.

19. A refractory composite material as set forth in claim 18 wherein
the particular element is boron and the porous substrate means includes carbon.

20. A combination as set forth in claim 18, including,
the substrate means being permeable to oxygen,
the barrier means being impermeable to oxygen.

21. A combination as set forth in claim 20, including,
the matrix being permeable to oxygen, and
an impermeable layer disposed on the permeable layer and having refractory properties and including a metal and an element chemically bonded to the metal.

22. A combination as set forth in claim 22,
the substrate means including carbon,
the particular element constituting boron and
the element chemically bonded to the metal in the matrix being selected from the group consisting of oxygen, carbon, nitrogen and boron.

23. A method of producing a refractory composite material, including the steps of:
forming a plurality of discrete elements into a porous substrate, the discrete elements being permeable to oxygen,
depositing a layer of a pyrolytic material on the discrete elements by chemical vapor infiltration to cover the discrete elements in the substrate, the pyrolytic material being permeable to oxygen,
depositing a layer of a barrier material on the pyrolytic layer by chemical vapor infiltration to cover the pyrolytic layer, and
depositing by a chemical vapor infiltration a layer on the barrier layer of a material impermeable to oxygen to cover the material of the barrier layer,
the barrier material having properties of inhibiting the diffusion of the impermeable material into the pyrolytic 24. A method as set forth in claim 23, wherein
the discrete elements in the substrate are formed from a material including carbon,
the pyrolytic material includes carbon,
the barrier material includes an element selected from the group consisting of silicon and boron, and
the impermeable material includes an element selected from the group consisting of silicon and boron.

25. A method as set forth in claim 23 wherein
the barrier material includes a particular element and
the impermeable material includes the particular element
the barrier material has properties of inhibiting the diffusion of the particular element from the impermeable layer into the layer of pyrolytic material.

26. A method as set forth in claim 23, including the step of:
depositing a matrix on the layer of permeable material, the matrix constituting a refractory material and being formed from a metallic element and another element chemically bonded to the metallic element,
the substrate having a first coefficient of thermal expansion and the matrix having a second coefficient of thermal expansion different from the first coefficient of thermal expansion,
the pyrolytic layer having properties of providing for a minimal bonding between the substrate and the matrix to obtain a displacement of the matrix relative to the substrate with changes in temperature.

27. A method as set forth in claim 26, including the step of:
depositing a layer of an impermeable material on the matrix, the impermeable material constituting a refractory material formed from a metallic element and another element chemically bonded to the metallic element.

28. A method as set forth in claim 27 wherein
the discrete elements in the substrate include carbon and
the pyrolytic material includes carbon and
the barrier material includes boron and
the impermeable material on the layer of the barrier material includes boron.

29. A method of forming a refractory composite material, including the following steps:
   forming a permeable, porous substrate,
   depositing a pyrolytic material on the substrate,
   depositing a barrier material on the pyrolytic material,
   depositing an impermeable material on the barrier material where the impermeable material is impermeable to oxygen,
   the barrier material having properties of inhibiting any diffusion of the impermeable material into the pyrolytic layer, and
   depositing a matrix of a refractory material on the impermeable material, the refractory material including a metallic element and an element chemically bonded to the refractory element.

30. A method as set forth in claim 29, wherein
   the substrate has a first coefficient of thermal expansion and the matrix has a second coefficient of thermal expansion different from the first coefficient of thermal expansion and there is a minimal bond between the substrate and the matrix to provide for a movement of the matrix relative to the substrate with changes in temperature.

31. A method as set forth in claim 30, including the step of:
   depositing an impermeable material on the matrix where the impermeable material is impermeable to oxygen.

32. A method as set forth in claim 29 wherein
   the barrier material, the impermeable material and the matrix are successively deposited on the pyrolytic material at an elevated temperature and alternately in opposite directions and with a pressure pulsating at a particular rate between first and second limits of pressure to obtain a uniform deposition of the barrier material, the impermeable material and the matrix in successive layers on the pyrolytic material.

33. A method of making a refractory composite material, including the steps of:
   providing a porous substrate having a first coefficient of thermal expansion,
   passing gases through the substrate alternately in one direction and then in the opposite direction to deposit, by chemical vapor infiltration, an impermeable layer on the substrate, and
   passing gases through the substrate alternately in one direction and then in the other direction to deposit, by chemical vapor infiltration, on the substrate a matrix having a second coefficient of thermal expansion different from the first coefficient of thermal expansion and having a minimal bond to the substrate to provide for a displacement of the matrix relative to the substrate with changes in temperature.

34. A method as set forth in claim 33 wherein
   the pressure of the gases producing the impermeable layer is pulsated between first and second limits during the infiltration of the gases through the substrate and
   the pressure of the gases producing the matrix is pulsated between the first and second limits during the infiltration of the gases through the substrate.

35. A method as set forth in claim 34, including the step of:
   passing gases through the substrate alternately in one direction and then in the other direction to deposit, by chemical vapor infiltration, an impermeable layer on the substrate with the second coefficient of thermal expansion.

36. A method as set forth in claim 33 wherein
   the impermeable layer actually includes a barrier layer having properties of inhibiting diffusion of material from the impermeable layer into the substrate.

37. A method as set forth in claim 33 wherein
   the impermeable layer is deposited in a substantially uniform thickness on the substrate and
   the matrix is deposited in a substantially uniform thickness on the impermeable layer.

* * * * *